(12) United States Patent
Ludwig et al.

(10) Patent No.: US 10,293,696 B2
(45) Date of Patent: May 21, 2019

(54) OPERATION OF AN INDUCTIVE POWER TRANSFER SYSTEM BASED ON DETECTING AN ARRANGEMENT

(71) Applicant: Bombardier Primove GmbH, Berlin (DE)

(72) Inventors: Christoph Ludwig, Constance (DE); Wolfgang Ludwig, Tagerwilen (CH); Adrianus Johannes Steinfort, Kreuzlingen (CH); Marnix Lannoije, Heidelberg (DE)

(73) Assignee: Bombardier Primove GmbH, Berlin (DE)

( * ) Notice: Subject to any disclaimer, the term of this patent is extended or adjusted under 35 U.S.C. 154(b) by 87 days.

(21) Appl. No.: 15/327,780

(22) PCT Filed: Jul. 22, 2015

(86) PCT No.: PCT/EP2015/066774
§ 371 (c)(1),
(2) Date: Jan. 20, 2017

(87) PCT Pub. No.: WO2016/012505
PCT Pub. Date: Jan. 28, 2016

(65) Prior Publication Data
US 2017/0203657 A1 Jul. 20, 2017

(30) Foreign Application Priority Data
Jul. 23, 2014 (GB) .................................. 1413024.9

(51) Int. Cl.
*B60L 11/18* (2006.01)
*H02J 5/00* (2016.01)
(Continued)

(52) U.S. Cl.
CPC ......... *B60L 11/182* (2013.01); *B60L 11/1824* (2013.01); *B60L 11/1829* (2013.01);
(Continued)

(58) Field of Classification Search
CPC ................ B60L 11/182; B60L 11/1824; B60L 11/1838; B60L 11/1829; B60L 7/025;
(Continued)

(56) References Cited

U.S. PATENT DOCUMENTS 8,884,468 B2 11/2014 Lemmens et al.
9,178,361 B2 * 11/2015 Liu .......................... H02J 5/005
(Continued)

FOREIGN PATENT DOCUMENTS

DE 102014207427 A1 10/2015
EP 2717430 A1 4/2014
(Continued)

*Primary Examiner* — Naum Levin
(74) *Attorney, Agent, or Firm* — The Webb Law Firm

(57) ABSTRACT

The invention relates to method of detecting an arrangement having a primary unit of an inductive power transfer system and/or a secondary unit of the inductive power transfer system. The method including: using a detector device to detect the arrangement, the detector device having at least one electrical conductor, determining at least one electrical property of the detector device and generating determination results consisting of a determination result for each of different regions of the arrangement, and comparing the determination results with existing information about the arrangement to be detected. The existing information includes information about expected values for the different regions of the arrangement, thereby generating a comparison result, and deciding from the comparison result whether the determination results indicate that the detector device has detected the arrangement as expected.

19 Claims, 2 Drawing Sheets

(51) Int. Cl.
*H02J 7/02* (2016.01)
*H02J 50/90* (2016.01)
*H02J 50/12* (2016.01)
*G01R 29/08* (2006.01)
*G01R 29/00* (2006.01)

(52) U.S. Cl.
CPC .......... *B60L 11/1838* (2013.01); *G01R 29/00* (2013.01); *G01R 29/0878* (2013.01); *H02J 5/005* (2013.01); *H02J 7/025* (2013.01); *H02J 50/12* (2016.02); *H02J 50/90* (2016.02); *B60L 2270/147* (2013.01); *Y02T 10/7005* (2013.01); *Y02T 10/7072* (2013.01); *Y02T 90/121* (2013.01); *Y02T 90/122* (2013.01); *Y02T 90/125* (2013.01); *Y02T 90/128* (2013.01); *Y02T 90/14* (2013.01); *Y02T 90/163* (2013.01)

(58) Field of Classification Search
CPC ..... G01R 29/00; G01R 29/0878; H02J 50/12; H02J 50/90; H02J 7/025; H02J 5/005; Y02T 10/7005; Y02T 90/128; Y02T 90/14; Y02T 90/121; Y02T 90/163; Y02T 90/122; Y02T 90/125; Y02T 10/7072
See application file for complete search history.

(56) References Cited

U.S. PATENT DOCUMENTS

| | | | | |
|---|---|---|---|---|
| 9,281,708 B2* | 3/2016 | Wechlin | ...... | B60L 3/00 |
| 9,553,636 B2* | 1/2017 | Maikawa | ...... | H02J 50/10 |
| 9,726,518 B2* | 8/2017 | Widmer | ...... | G01D 5/2006 |
| 9,772,401 B2* | 9/2017 | Widmer | ...... | G01S 13/04 |
| 9,829,454 B2* | 11/2017 | Urano | ...... | H01F 27/402 |
| 9,857,495 B2* | 1/2018 | Eiermann | ...... | G01V 3/10 |
| 2012/0175967 A1 | 7/2012 | Dibben et al. | | |
| 2012/0181875 A1* | 7/2012 | Wechlin | ...... | B60L 3/00 307/104 |
| 2014/0111019 A1 | 4/2014 | Roy et al. | | |
| 2014/0145514 A1 | 5/2014 | Konno et al. | | |
| 2015/0288214 A1 | 10/2015 | Borngraber | | |
| 2015/0321567 A1 | 11/2015 | Czainski | | |
| 2016/0006260 A1* | 1/2016 | Nakamura | ...... | G01V 3/104 307/104 |
| 2016/0172891 A1* | 6/2016 | Filippenko | ...... | H02J 17/00 320/108 |
| 2016/0187519 A1* | 6/2016 | Widmer | ...... | G01V 3/10 324/222 |
| 2016/0325631 A1 | 11/2016 | Lannoije et al. | | |
| 2016/0372980 A1 | 12/2016 | Lannoije et al. | | |
| 2017/0033616 A1* | 2/2017 | Ludwig | ...... | B60L 11/182 |
| 2017/0163100 A1* | 6/2017 | Vocke | ...... | H02J 50/12 |

FOREIGN PATENT DOCUMENTS

| | | |
|---|---|---|
| GB | 2517679 A | 3/2015 |
| GB | 2520990 A | 6/2015 |
| WO | 2009081115 A1 | 7/2009 |
| WO | 2014064489 A1 | 5/2014 |
| WO | 2014095722 A2 | 6/2014 |

* cited by examiner

OPERATION OF AN INDUCTIVE POWER TRANSFER SYSTEM BASED ON DETECTING AN ARRANGEMENT

CROSS-REFERENCE TO RELATED APPLICATIONS

This application is the U.S. national phase of International Application No. PCT/EP2015/066774 filed Jul. 22, 2015, and claims priority to United Kingdom Patent Application No. 1413024.9 filed Jul. 23, 2014, the disclosures of which are hereby incorporated in their entirety by reference.

BACKGROUND OF THE INVENTION

Field of the Invention

The invention relates to the operation of an inductive power transfer (IPT) system. The invention includes (i) a method of detecting an arrangement, (ii) a method of operating an IPT system comprising the method of detecting the arrangement, (iii) a primary unit arrangement of an IPT system and (iv) a secondary unit arrangement of an IPT system.

The IPT system comprises a primary (side) unit with a primary winding structure, which primary unit is located in particular on a route or on a stop (e.g. a bus stop or parking area) of a vehicle which can drive along the route. The primary winding structure generates a magnetic field which is received by a secondary (side) unit of the IPT system that is also known as receiver or pick-up. In case of a vehicle, it may be related to as on-board receiving unit (ORU). The secondary unit has a secondary winding structure. The primary and secondary winding structures comprise windings of in each case at least one electric conductor. In between the primary winding structure and the secondary winding structure, there is an air gap through which the generated electromagnetic field extends during operation. An electric voltage is induced in the secondary winding structure and, while the secondary unit provides power to any load, the load current through the secondary winding structure generates a secondary electromagnetic field. This current depends at least partially on the mutual induction between the primary winding structure and the secondary winding structure. The primary unit and the secondary unit form an electrical transformer.

Description of Related Art

The IPT system can be used for static energy transfer or static charging of a vehicle, i.e. the vehicle does not move during energy transfer. In this case, the primary unit can be designed as a so-called charging pad, which may be integrated into the route or mounted on the route surface as an elevated charging pad. Alternatively, the IPT system can be a dynamic system transferring energy while the vehicle travels along the driving surface of the route.

WO 2014/095722 A2 discloses a safety system for an inductive power transfer system that transfers power to a vehicle on a surface of a route, wherein the safety system comprises at least one inductive sensing system, wherein the inductive sensing system comprises multiple detection windings and wherein the multiple detection windings are arranged in an array structure, which at least partially covers a charging surface that is assigned to the primary winding. The safety system detects foreign objects, in particular metal objects, located in proximity of the primary winding structure.

The primary unit and the secondary unit of the IPT system comprise electrically conductive parts, at least the windings mentioned above. Typically, they also comprise magnetic or magnetizable material, in particular ferrites, for shaping the magnetic field of the IPT system during operation. Since there is an air gap between the primary unit and the secondary unit, the units are movable relative to each other. Therefore, a vehicle having an on-board secondary unit can move to a predetermined position where the energy transfer from the primary unit to the secondary unit is optimal. Consequently, there is a need to ensure that the secondary unit is actually in the optimal position. For example, mechanical means may be provided for this purpose. Another option is a control device which controls positioning the vehicle based on contactless detecting the relative position of the primary and secondary unit.

The same primary unit may be used to provide energy to different vehicles one after the other. For different reasons, there is a need to detect or recognize which vehicle or which type of secondary unit is actually positioned close to the primary unit. One possible reason is that the billing for the energy delivered must be directed to the correct address. Another possible reason is that there may be different types of secondary units and that the primary unit may be operated in a different manner depending on the type of the secondary unit which is to be provided with energy.

Another aspect of operating an IPT system is the detection of undesired, foreign objects which are not part of the IPT system. According to WO 2014/095722 A2, a safety system is provided for this purpose. In particular, if the foreign object is electrically conductive, it can be heated up rapidly, thereby becoming a dangerous hot object. In addition, the foreign object may deteriorate the energy transfer to the secondary unit.

SUMMARY OF THE INVENTION

It is an object of the present invention to improve the operation of an IPT system with respect to at least one of the needs and requirements mentioned above.

According to a basic idea of the present invention, each primary unit and each secondary unit of an IPT system has a specific structure which can be detected in a contactless manner, thereby detecting the unit or detecting an arrangement comprising the unit and at least one further object. A corresponding detection unit or detection arrangement can therefore detect a signature of the unit or arrangement which is characteristic for the unit or arrangement. In particular, different types of primary units and different types of secondary units have different signatures. Depending on the precision of detecting the signature, it is even possible to distinguish between different primary units of the same type or between different secondary units of the same type. This may be facilitated by providing the unit with an individual feature which is not present in all other units of the same type. For example, an electrically conductive and/or magnetizable part may be shaped and/or positioned in an individual manner in the unit.

The contactless detection performed by the detector device is preferable performed by determining at least one electrical property. The property in particular corresponds to at least one physical quantity that is measured in order to determine the property. In particular inductive and/or capacitive coupling of the unit or arrangement to be detected with the detector device can influence electrical properties of the detector device. Therefore, the signature may be considered as a magnetic signature in case of inductive coupling and/or may be considered as an electrical signature in case of capacitive coupling.

In particular, the signature of the primary or secondary unit is obtained and therefor known before the unit or an arrangement comprising the unit is detected by the detector device. Depending on the further processing of the results of the detection, the signature can be obtained during a previous operation of the detector device or of another detector device of the same type or can be calculated using information about the structure of the unit or arrangement. The signature can be stored in a data storage of the arrangement comprising the primary unit or the secondary unit. In addition or alternatively, the signature can be stored in a data storage of a central system which communicates with the IPT system and preferably communicates with a plurality of IPT systems.

In particular, the signature and the detection results of the detector device can comprise information with respect to two local dimensions, for example with respect to two axes of a two-dimensional coordinate system. In this case, the signature and the detection result correspond to a two-dimensional image, similar to a photograph taken by a digital camera. Different regions of the unit or arrangement can be captured by the signature or detection result, wherein the individual results of the regions correspond to pixels of a digital image or photograph. In the following, they are referred to as pixels. Each pixel may have a single value characterizing the material of the region of the unit or arrangement which is captured by the pixel. For example, typical materials used for the primary unit and secondary unit are copper as the material of the windings, ferrite, plastic as electrical insulator and optionally other metals, such as aluminum, for shielding the environment from the fields of the IPT system. For example, each value of the pixels may indicate the material which is predominant in the captured region. The pixels may be arranged in rows and columns, wherein the number of pixels in each row and each column may, for example, be a number in the range of 5 to 200. In any case, it is preferred that the signature and the detection result have the same numbers of pixels in their rows and columns. However, this is not necessarily the case. For example, the signature may have more pixels and areas comprising a plurality of the pixels may be combined so as to form a combined pixel in order to compare the signature with the detection result.

It is also possible that the signature and the detection result correspond to a three-dimensional image. This means that not only image information with respect to two directions transverse to the viewing direction is obtained by the detector device, but additional image information with respect to the viewing direction. This additional information can be obtained, since the inductive or capacitive coupling of the arrangement to be detected with the detector device depends on the distance of the arrangement to the detector device. For example, the same block of material (e.g. ferrite) of the secondary unit results in different values of the impedance of a detection element of the detector device depending on the distance to the detection element.

Surfaces of the primary unit and of the secondary unit may face each other during operation of the IPT system. It is preferred that the detector device comprises a plurality of detection elements which are arranged next to each other so as to define a detector area extending in a plane. They form an array of rows and columns, wherein each detection element defines a position in the array characterized by the ordinal numbers of its row and its column. The detection elements are preferably formed by in each case at least one winding of an electric line so as to form a coil. Each winding may have one turn or more than one turn. The interior areas enclosed by the winding or windings of each detection element may overlap or may not overlap. Preferably, the array of detection elements is oriented in a direction of the magnetic flux line or lines at the highest flux density of the magnetic field produced by the primary unit during operation of the IPT system. This direction may extend perpendicularly to the plane mentioned above. In particular, the area defined by the array may fully cover the area of the primary unit windings and/or of the secondary unit windings. This means that the detector device is capable of providing an image at least of the area in which the windings of the unit or units is placed. Preferably, the array covers—if viewed in the direction of the highest flux density of the IPT system—not only the windings, but also peripheral components of the unit, such as shields for shielding the environment from the field of the IPT system or magnetizable material.

In addition or alternatively to the configuration of the detector device having a plurality of detection elements as mentioned above, the detector device can be moved so as to scan the unit or arrangement to be detected. For example, the detector device may be moved in the plane mentioned above. Alternatively, the orientation of the detector device may be changed in order to scan the unit or arrangement.

Comparing the signature with the detection result may reveal unexpected deviations. This indicates the presence of a foreign object and may trigger an action, such as prohibiting or modifying the operation of the IPT system. In order to increase the reliability of the determination of a deviation between signature and detection results, the material of the potential foreign object may be determined from the detection results.

In addition or alternatively, the signature and the detection result may be used to identify a specific specimen and/or a specific type of a primary unit or of a secondary unit. Further in addition or alternatively, the signature and the detection result can be compared in order to determine a positional deviation from an optimal relative position of the primary unit and the secondary unit. In this case, the result of the comparison can be output to a motion control device which controls motion of at least one of the primary and secondary unit so that the optimal position is reached. The term "position" includes the orientation in this context.

One advantage of determining at least one electrical property of the detector device, which property depends on the inductive or capacitive coupling through the arrangement to be detected, is the fact that the detection result does not significantly depend on the temperature. Another advantage is that the arrangement can be detected while it moves. This applies to the relative motion of the primary and the secondary unit mentioned above. This also applies to foreign objects which move in or into the air gap between the primary unit and the secondary unit.

In particular, the following is proposed:

A method of detecting an arrangement comprising a primary unit of an inductive power transfer system and/or a secondary unit of the inductive power transfer system, the method comprising:

using a detector device to detect the arrangement, the detector device comprising at least one electrical conductor, determining at least one electrical property of the detector device and generating determination results consisting of a determination result for each of different regions of the arrangement, comparing the determination results with existing information about the arrangement to be detected, wherein the existing information includes information about expected values for the different regions of the arrangement, thereby generating a comparison result, deciding from the comparison result whether the determination results indicate that the detector device has detected the arrangement as expected.

The invention also covers a method of operating an inductive power transfer system, comprising the method of detecting the arrangement, wherein an operation of the IPT is not started, is stopped or is modified, if it is decided from the comparison result that the determination results do not indicate that the detector device has detected the arrangement as expected. For example, the arrangement is not as expected if there is a foreign object or if the primary unit of the secondary unit is not the expected specimen or of the expected type.

Furthermore, a primary (first option) or secondary (second option) unit arrangement of an inductive power transfer system is proposed, the arrangement comprising:

a primary unit having a primary winding structure for generating an electromagnetic field to be received by a secondary unit of the inductive power transfer system in which an electric voltage is induced by magnetic induction (first option), or a secondary unit having a secondary winding structure for receiving an electromagnetic field generated by a primary unit of the IPT system (second option), a detector device for detecting an arrangement comprising the secondary unit (first option) or the primary unit (second option), the detector device comprising an electrical conductor, a determination unit for determining at least one electrical property of the detector device for different regions of the arrangement, thereby generating determination results consisting of a determination result for different regions of the arrangement, a comparison unit for comparing the determination results with existing information about the arrangement to be detected, wherein the existing information includes information about expected values for the different regions of the arrangement, thereby generating a comparison result, a decision unit for deciding from the comparison result whether the determination results indicates that the detector device has detected the arrangement as expected.

The determination result for each of the different regions of the arrangement may be a determined value (e.g. the value of an impedance or of an inductive or capacitive reactance) or a set of determined values (e.g. values at different frequencies) of the at least one electrical property. However, it is preferred that the determined value(s) is/are further processed in order to obtain the determination result. For example, the determined values for each region are classified so that a determination result is obtained which indicates the predominant material in the region of the arrangement.

The information about expected values for the different regions of the arrangement may be information derived from expected values of the at least one electrical property to be determined. The information about expected values of the at least one electrical property may consist of the material which is expected in the corresponding region of the arrangement.

As mentioned above, the detector device may comprise a plurality of detection elements. They may be used or adapted to detect the arrangement, wherein each detection element comprises an electrical conductor, wherein each of the plurality of detection elements is assigned to one or more than one of the different regions of the arrangement and wherein at least one electrical property of each of the detection elements is determined, thereby generating the determination results consisting of a determination result for each of the detection elements.

The arrangement may comprise a detection field antenna or, preferably, a plurality of detection field antennae, which may be used to generate an electromagnetic detection field or electromagnetic detection fields, wherein the determination results are obtained in response to the electromagnetic detection field(s). The electromagnetic detection field(s) couple(s) the arrangement to be detected with the detector device. According to one option, the detection field antenna(e) may be element(s) in addition to the at least one detection element of the detector device. If the detector device comprises a plurality of the detection elements, there are separate field antennae and detection elements. According to another option, the detection element(s) is/are the field antenna(e). This means that the detection element(s) is/are used to generate the electromagnetic detection field(s). In any case, the field antenna(e) may be formed by in each case at least one winding of an electric conductor (in particular an electric line) so that each field antenna comprises a coil. The detection element(s) of the detector device and the field antenna(e) may carried by the same electric board. The windings of the electric lines of the detection element(s) and of the field antenna(e) may be strip conductors (e.g. printed) on the board.

The primary unit or secondary unit arrangement may further comprise at least one detection field generator for generating an electromagnetic detection field, the detection field generator having an alternating voltage source which is electrically coupled or can be coupled to at least one detection field antenna, thereby forming an oscillating circuit in order to generate an electromagnetic detection field or electromagnetic detection fields, wherein the determination results are obtained in response to the detection field(s).

Examples of the configuration and operation of an inductive detection system are described in WO 2014/095722 A2 with reference to FIG. 1-13, 18, 19 of the document. Individual detection elements and detection field antennae can be configured and operated in this manner. Examples of the configuration and operation of arrays of detection windings are described in WO 2014/095722 A2 with reference to FIG. 14-17 of the document. Arrays of detection elements and detection field antennae can be configured and operated in this manner. However, the document does not disclose the concept of detecting a unit or an arrangement of an IPT system and comparing the detection result with a signature of the unit or of the arrangement.

It is preferred that the at least one electrical property depends on a frequency of an electromagnetic detection field, which couples the detector device with the arrangement to be detected. In this case, the at least one electrical property (e.g. the inductive reactance of the detection element inductively coupled to the assigned region of the arrangement) can be determined with respect to a plurality of frequency values, thereby determining information on a frequency dependency of the at least one electrical property. The determination unit of the primary unit or secondary unit arrangement may be adapted in this manner. The information on the frequency dependency can then be used to identify different materials of the arrangement. The underlying finding of this embodiment is that the material properties (in particular the electrical conductivity, the magnetic permeability and the electron mobility) depend on the frequency of the electromagnetic field which couples the material to the detector device and that the dependency characterizes the material. While some materials may have the same material property at a first frequency, they most likely have different material properties at another, second frequency. Therefore, the embodiment of taking the frequency dependency into account is in particular applicable to the determination of the predominant material in a region of the arrangement to be detected as mentioned above. In particular, not only the fact that a specific material is predominant in the region can be determined, but the intensity, in particular the amplitude, of the at least one electrical property can be determined. This intensity, in particular amplitude, contains information about the amount and geometrical extension of the material. As a consequence, the pixels mentioned above may not only have one value, but two values or more values. For example, one value is the type of material and a second value is a value characterizing the amount and/or geometrical extension of the material.

Different physical effects may constitute the inductive and/or capacitive coupling of the arrangement to be detected with the detector device. In particular, eddy currents are induced by the electromagnetic detection field(s) in electrically conductive material of the arrangement. In case of electrically non-conductive material, the electrons in the material can be excited by the electromagnetic detection field(s) so as to perform oscillations. In both cases, the electrons moving within the material produces an electromagnetic field which inductively and/or capacitively couples with the detector device. Corresponding magnetic effects also occur. In particular, the electromagnetic detection field(s) cause(s) local magnetization of the material according to the material properties.

Another physical effect which may take place in particular in addition to the effects mentioned before is the excitation of electric currents through the windings of the primary unit and/or secondary unit. These units typically have at least one resonance frequency, i.e. an electromagnetic field or an alternating voltage having the resonance frequency produces an alternating electric current through the windings with a high amplitude. Again, the electric current produces an electromagnetic field which inductively and/or capacitively couples with the detector device. The difference of electric currents through the windings on one hand and eddy currents, electron oscillations and local magnetisation on the other hand is the size of the region where the effect occurs. The electric currents through the windings result in a nearly homogeneous electromagnetic field within the area of the windings, while the other effects depend on the local material. This means that detection elements vis-à-vis the homogeneous area the same or nearly the same influence in case of an electric current through the windings, but detect different influences depending on the local material vis-à-vis the detection element in case of local effects. Both influences may occur and may be detected simultaneously. However, if the frequency dependency of the at least one electrical property of the detector device is determined, the influence of an electric current through the windings will provide the prevailing effect at or close to a resonance frequency of the windings and the local influences will provide the prevailing effect otherwise. For these reasons, it is preferred that the frequency dependency is considered for at least one resonance frequency and, in addition, for at least one other frequency. Therefore, the signature also comprises the information about this frequency dependency. While the detection of the local material of the primary or secondary unit is similar to the detection of metals and other materials in general, the detection of windings by evaluating the electrical property of the detector device at or close to a resonance frequency is a special feature. A foreign object interfering with the electromagnetic detection field(s) can be detected in both cases. It would alter the determination results compared to the signature at or close to the resonance frequency and otherwise.

According to a specific embodiment of the method, the at least one electrical property depends on a frequency of an electromagnetic detection field, which couples the detector device with the arrangement to be detected, wherein the at least one electrical property is determined with respect to a resonance frequency of a winding or of windings of at least one electrical conductor of the primary unit and/or the secondary unit.

In particular, the determination unit may be adapted to determine the at least one electrical property with respect to at least one frequency of an electromagnetic detection field, which couples the detector device with the arrangement to be detected, wherein the at least one electrical property is determined with respect to one frequency or more than one frequencies which is a resonance frequency or which are resonance frequencies of a winding or of windings of at least one electrical conductor of the primary unit and/or the secondary unit.

The electromagnetic detection field(s) produced by the detection field antenna(e) may have a first oscillating frequency during a first mode of operation and may have a second oscillating frequency during a second mode of operation. It is preferred that the modes of operation are performed one after the other. Alternatively, the electromagnetic field(s) may have an oscillating frequency spectrum. In particular, the electromagnetic field(s) may be generated at an oscillating frequency or at oscillating frequencies in the frequency range of 1 kHz to 5 MHz, in particular in the range of 1 kHz to 500 kHz. Preferably, no oscillating frequency is smaller than 10 kHz. If electromagnetic fields are generated at single frequencies in different modes of operation (see above), these frequencies may be 10 kHz, 20 kHz, 30 kHz, wherein electromagnetic field(s) having at least two of these frequencies are generated. Preferably, the IPT system is operated at a resonance frequency of the secondary unit. In this case it is further preferred that the electromagnetic detection field(s) is/are not generated at the resonance frequency. In particular, the frequency of the electromagnetic detection field(s) differs from the resonance frequency by at least 10 kHz.

It should be noted that not only electrically conducting materials, such as metals, can be detected by the detector device. Rather, since the electron mobility is a material property which strongly influences the inductive and/or capacitive coupling of the material to the detector device, also electrically non-conductive materials can be detected. In particular, this applies to ferrites. A class of ferrites which can be used for IPT systems consists of electrically non-conductive ferrimagnetic ceramic compounds derived from iron oxides and/or from oxides of other metals.

The determination results may be ordered according to a geometric order of the different regions of the arrangement so as to prepare comparing the determination results with the existing information. In particular, the geometric order is the order of the two-dimensional image having pixels mentioned above. Therefore, the comparison may be made as principally known from comparisons of digital images.

The at least one deviation between the determination results and the existing information may be detected and it may be decided that the arrangement comprises an additional object, which is part of the detected arrangement in addition to the primary unit and/or secondary unit.

A location of the additional object may be determined by determining a corresponding one or a corresponding plurality of the different regions of the arrangement for which the determination result(s) deviate(s) from the existing information. The location may be output in order to control the operation of the IPT system and/or to inform an operator person or a central system common to a plurality of IPT systems.

The determination results may be compared with existing information about a plurality of possible arrangements to be detected, wherein one of the plurality of possible arrangements is identified as an arrangement actually detected by the plurality of detection elements. The arrangement is identified if its signature matches the determination results. Optionally, the matching signature and determination results may be allowed to have a predetermined tolerance deviation which may be predetermined for each of the different regions of the arrangement and/or for the total images.

BRIEF DESCRIPTION OF THE DRAWINGS

Examples of the present invention will be described with reference to the attached drawings in which:

FIG. 3 shows an area on the right hand side of FIG. 2 as detected by the detector device and FIG. 4 shows the area of FIG. 3 and an additional foreign object as detected by the detector device.

DETAILED DESCRIPTION OF THE INVENTION

Figure 1:
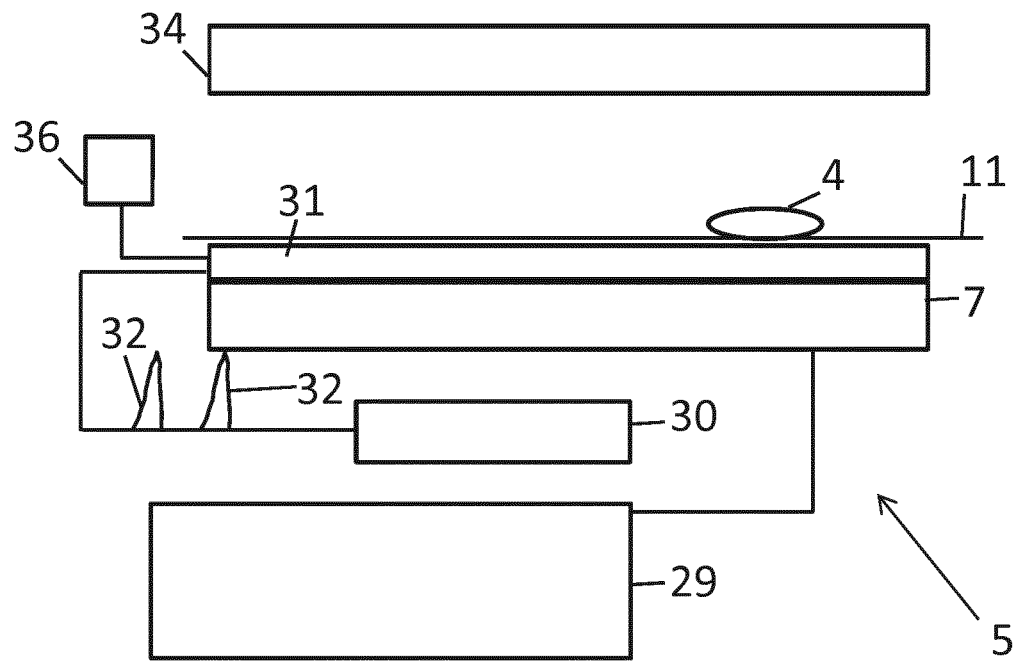
FIG. 1 shows an IPT system with a detector device.

The IPT system 5 shown in FIG. 1 comprises a primary unit 7 embedded in the ground and a secondary unit 34 being part of an on-board receiving unit on board a vehicle (not shown). During operation, the primary unit 7 is provided with power from a primary side power converter 29 and generates an electromagnetic field, thereby transferring power to the secondary unit 34.

A detector device 31 is placed above the primary unit 7 and below the surface of a route 11, i.e. the detector device 31 is placed in between the primary unit 7 and the secondary unit 34. A voltage generator 30 is electrically connected to the detector device 31 and, for example, generates voltage pulses 32 which cause detection field antennae (not shown) integrated in the detector device 31 to generate electromagnetic fields. Other than schematically shown in FIG. 1, the voltage generator 30 may produce pulse width modulation signals. Generally speaking, the voltage generator 30 may produce any desired frequency or range of frequencies. In particular, the electromagnetic detection field(s) produced by operating the voltage generator 30 may comprise at least one resonance frequency of a winding of the secondary unit 34 and, in addition, may comprise at least one further frequency so that resonant currents through the winding and local effects (e.g. eddy currents) in the material of the secondary unit 34 are triggered.

The electromagnetic fields inductively couple the arrangement consisting of the secondary unit 34 and of a foreign object 4 on the surface of the route 11 to the detector device 31. An evaluation device 36 is connected to the detector device 31, which evaluation device 36 comprises a determination unit for determining at least one electrical property of the detector device 31 for different regions of the arrangement 4, 34, comprises a comparison unit for comparing the determination results with existing information about the arrangement 4, 34 to be detected and comprises a decision unit deciding from the comparison result whether the determination results indicate that the detector device 31 has detected the secondary unit 34 as expected. Since there is the foreign object 4, the secondary unit 34 has not been detected as expected.

If the foreign object 4 is an electrically conductive object eddy currents are induced in the object 4 and interact with the electromagnetic fields. Otherwise, depending on the electron mobility in the object 4, it may interact with the electromagnetic fields by induced oscillations of the electrons. Magnetisable objects interfere with the magnetic component of the electromagnetic fields. Only if the foreign object 4 does not interact at all with the electromagnetic fields, it cannot be detected by the detector device 31. In this case, the foreign object 4 does not interfere with the operation of the IPT system.

Several alternative embodiments and modifications to the embodiment shown in FIG. 1 are possible. For example, the detector device may be combined with the secondary unit and may be located at the lower surface of the secondary unit 34 shown in FIG. 1. Alternatively, a detector device may be combined with each of the primary and secondary unit. In any case, it is preferred that the detector device(s) is/are placed in between the primary unit and the secondary unit.

Figure 2:
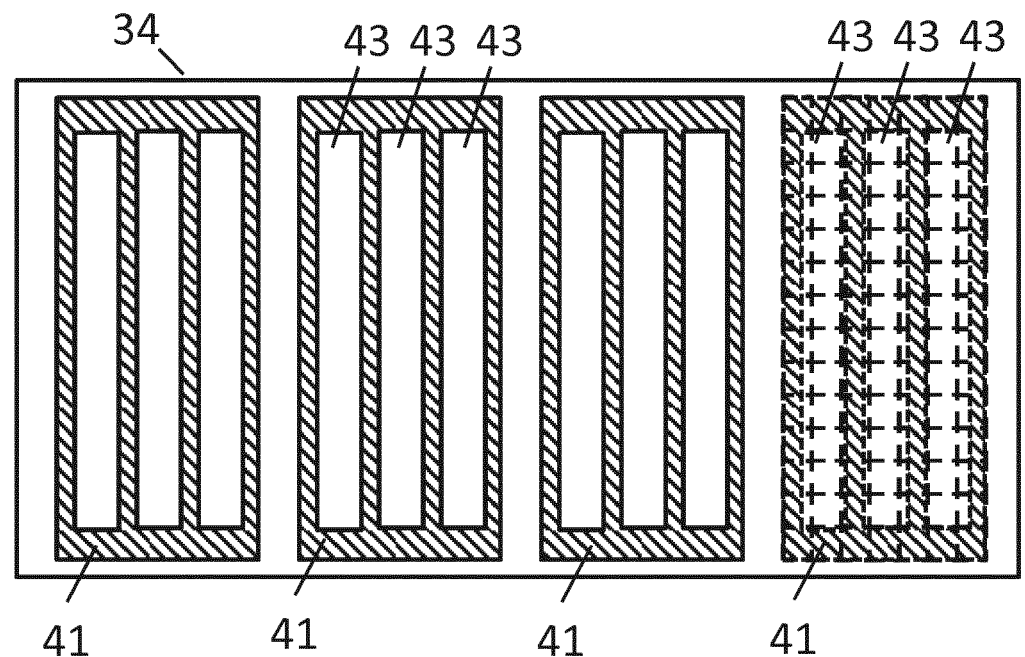
FIG. 2 schematically shows a secondary unit of an IPT system as viewed from the detector device on a primary side of the IPT system, in particular the secondary unit of FIG. 1.

In FIG. 2, the structure of a secondary unit 34 is shown as can be detected by a detector device on the primary side of the IPT system. The secondary unit comprises a plurality of coils of electric lines which are referred to as windings 43 that form the winding structure of the secondary unit 34. In the viewing direction behind the windings 43 shields 41 of magnetizable material, in particular of ferrite, are placed. There are four shields 41 and in front of each shield 41, three windings 43 are placed. The windings 43 extend in parallel to each other in a longitudinal direction, the direction from top to bottom in FIG. 2. The structural groups comprising one shield 41 and three windings 43 are placed next to each other in the lateral direction perpendicular to the longitudinal direction.

A detector device, such as the detector device 31 of FIG. 1, preferably detects the whole structure shown in FIG. 2 and produces detected information for a plurality of regions of the structure, which can be processed to form a two-dimensional image of the structure. Each region results in a pixel of a two-dimensional image. A processing unit, e.g. the evaluation device 36 of FIG. 1, may be combined with the detector device which performs the processing steps necessary to form the image from the information detected by the detector device. The image may be represented by digital data in any form suitable for digital two-dimensional images. Analogue information about the at least one electrical property of the detector device, in particular of the individual detection elements of the detector device, is output from the detector device to an analogue/digital converter which converts the analogue information into digital information and outputs the digital information to the processing unit. It may be in practice, for example, a field programmable gate array (FPGA), a personal computer or another digital computing unit. The processing unit processes the received digital information and thereby generates the detection results. For example, it determines for each of the detection elements the phase angle and amplitude of the impedance of the detection element, in particular by evaluating the amplitude of the current through the detection element and the amplitude of the voltage across the detection element. In this case, the analogue information provided by the detector device comprises corresponding measurement values. Alternatively, other procedures for determining the impedance or inductive or capacitive reactance of the detection element can be performed. Preferably, the electrical property, which may be at least one of the electrical quantities mentioned, is determined at a plurality of frequency values of the frequency of the current through the detection element and of the voltage across the detection element.

In any case, it is preferred that for each region of the detected structure, in particular for each detection element which is assigned to one of the regions, the predominant material in the region is determined.

Figures 3, 4:
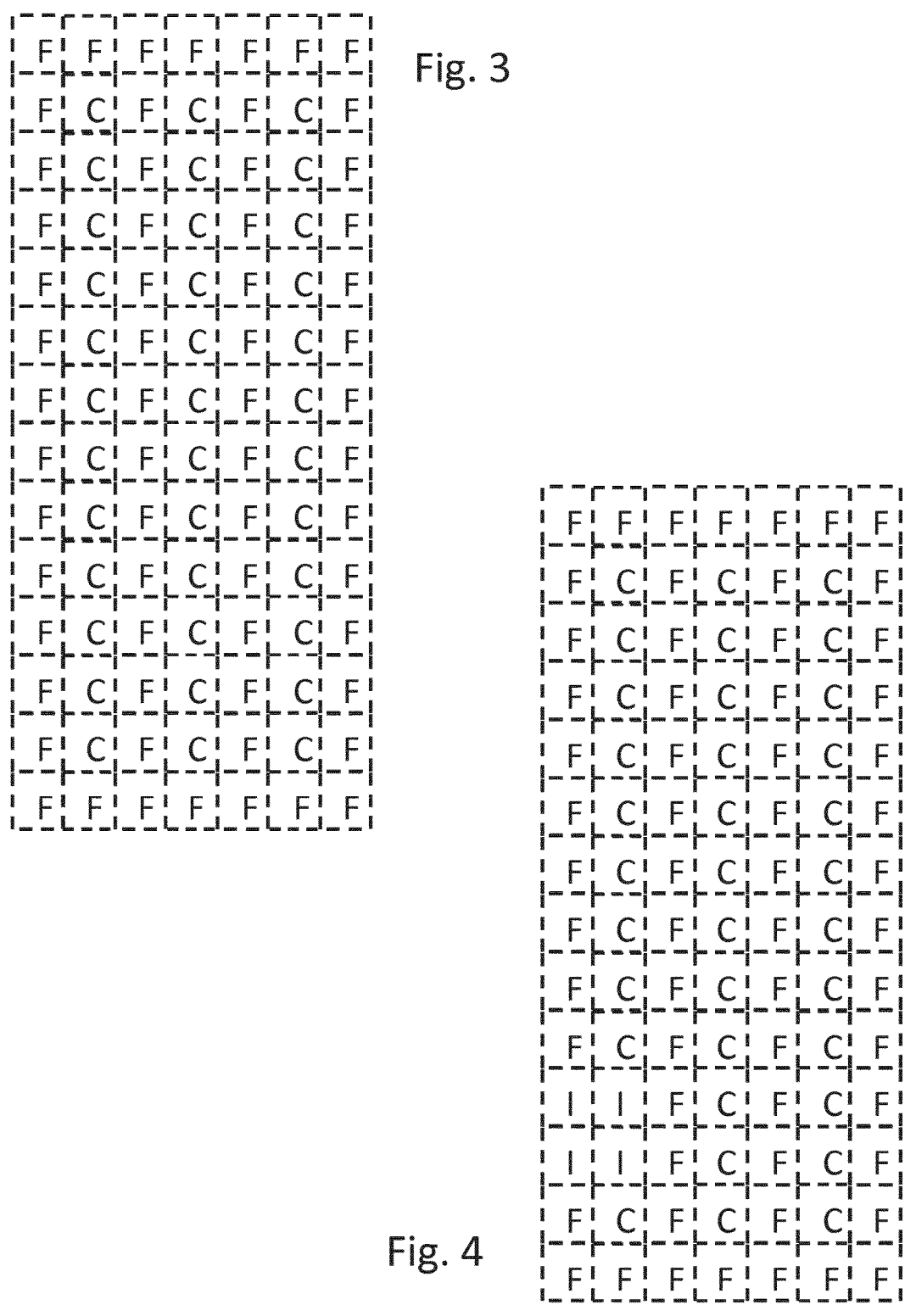

A corresponding image comprising pixels of the detected structure is shown in FIG. 3. For simplicity, only a part of the complete image is shown, namely the part which corresponds to the area on the right hand side in FIG. 2, where the shield 41 on the right hand side behind three of the windings 43 is located. This area in FIG. 2 shows the grid illustrated by dashed lines which corresponds to the partial image shown in FIG. 3. While the grid in FIG. 2 separates the individual regions of the structure which are detected by the detector device, the grid in FIG. 3 separates the pixels of the partial image obtained. Each pixel in FIG. 3 has a value which characterizes the predominant material in the corresponding region of the structure. In the example shown, the partial area has only two different predominant materials, namely copper of the windings 43 indicated by "C" and ferrite of the shield 41 indicated by "F".

If the foreign object 4 shown in FIG. 1 is present below the partial area which is represented by the partial image and if the foreign object interferes with the electromagnetic fields generated for detecting the structure, the material of the foreign object 4 is also detected, for example iron, and the pixels in the partial image which correspond to the region or regions of the foreign object 4 have the value "I" for iron (see FIG. 4) instead of the copper or ferrite shown in FIG. 3. While the partial image shown in FIG. 3 is identical to the signature of the structure, the modified image shown in FIG. 4 comprises pixels having the value "I". Therefore, the obtained image does not correspond to the signature. Consequently, the foreign object can be detected by comparing the image which is the signature of the structure with the image produced by the detector device and the processing unit. For the comparison, known methods of comparing digital images can be performed by a comparison unit implemented in the processing unit and a decision unit also implemented in the processing unit decides that there is a deviation between the signature and the image taken. In particular, the decision unit may output a deviation signal to a control of the IPT system, for example to a control of the power converter 29 shown in FIG. 1 and the control may switch off the primary unit, in particular by stopping operation of the power converter.

The invention claimed is:

1. A method of detecting an arrangement of a plurality of arrangements, each arrangement of the plurality of arrangements comprising a primary unit of an inductive power transfer system and/or a secondary unit of the inductive power transfer system, wherein each primary unit comprises a primary winding structure for generating a magnetic or electromagnetic field to be received by a corresponding secondary unit, wherein each secondary unit has a secondary winding structure in which an electric voltage is induced when the magnetic or electromagnetic field is received and wherein the method comprises:

using a detector device to detect an arrangement of a plurality of arrangements, the detector device comprising at least one electrical conductor, determining at least one electrical property of the detector device and generating determination results consisting of a determination result for each region of different regions of the detected arrangement, comparing the determination results with existing information about a plurality of signatures to generate a comparison result, wherein each signature of the plurality of signatures is characteristic for each possible arrangement of a plurality of possible arrangements that can be detected, wherein the existing information includes information about expected values for the different regions of a possible arrangement that can be detected, wherein different types of primary units have different signatures and/or different types of secondary units have different signatures, deciding, from the comparison result, whether the determination results indicate that the detector device has identified the detected arrangement as expected, thereby identifying the detected arrangement comprising a primary unit and/or a secondary unit, wherein the detected arrangement comprising the primary unit of a specific type of primary unit and/or the secondary unit of a specific type of secondary unit for which a specific type of primary unit and/or a specific type of secondary unit information about its signature exists, is identified by deciding from the comparison result whether the determination results indicate that the detector device has identified the detected arrangement comprising the primary unit of the specific type of primary unit and/or the secondary unit of the specific type of secondary unit.

2. The method of claim 1, wherein a plurality of detection elements of the detector device is used to detect the arrangement, wherein each detection element comprises an electrical conductor, wherein each of the plurality of detection elements is assigned to one or more than one of the different regions of the detected arrangement and wherein at least one electrical property of each of the detection elements is determined, thereby generating the determination results consisting of a determination result for each of the detection elements.

3. The method of claim 1, wherein a plurality of detection field antennae are used to generate an electromagnetic detection field or electromagnetic detection fields and wherein the determination results are obtained in response to the electromagnetic detection field.

4. The method of claim 1, wherein the at least one electrical property depends on a frequency of an electromagnetic detection field, which couples the detector device with the detected arrangement, wherein the at least one electrical property is determined with respect to a plurality of frequency values, thereby determining information on a frequency dependency of the at least one electrical property, and wherein the information on the frequency dependency is used to identify different materials of the detected arrangement.

5. The method of claim 1, wherein the at least one electrical property depends on a frequency of an electromagnetic detection field, which couples the detector device with the detected arrangement, wherein the at least one electrical property is determined with respect to a resonance frequency of a winding or of windings of at least one electrical conductor of the primary unit and/or the secondary unit.

6. The method of claim 1, wherein the determination results are ordered according to a geometric order of the different regions of the detected arrangement so as to prepare comparing the determination results with the existing information.

7. The method of claim 1, wherein at least one deviation between the determination results and the existing information is detected and it is decided that the detected arrangement comprises an additional object, which is part of the detected arrangement in addition to the primary unit and/or secondary unit.

8. The method of claim 7, wherein a location of the additional object is determined by determining a corresponding one or a corresponding plurality of the different regions of the detected arrangement for which the determination result deviates from the existing information.

9. The method of claim 1, wherein the determination results are compared with existing information about the plurality of possible arrangements that can be detected and wherein one of the plurality of possible arrangements is identified as the detected arrangement actually detected by the plurality of detection elements.

10. The method of claim 1, wherein different primary units of a same type of primary units have different individual signatures and/or different secondary units of a same type of secondary units have different individual signatures and wherein the detected arrangement comprising a specific primary unit of the same type of primary units and/or a specific secondary unit of the same type of secondary units, for which specific primary unit and/or specific secondary unit information about its individual signature exists, is identified by deciding from the comparison result whether the determination results indicate that the detector device has detected the detected arrangement comprising the specific primary unit of the same type of primary units and/or the specific secondary unit of the same type of secondary units.

11. The method of operating an inductive power transfer system, comprising the method of claim 1, wherein an operation of the inductive power transfer system is not started, is stopped or is modified, if it is decided from the comparison result that the determination results do not indicate that the detector device has detected the detected arrangement as expected.

12. The method of claim 1, wherein identifying the detected arrangement comprising the primary unit and/or the secondary unit comprises identifying the specific type of primary unit for the primary unit and/or the specific type of secondary unit for the secondary unit based on a signature that is characteristic of the specific type of primary unit for the primary unit and/or the specific type of secondary unit for the secondary unit.

13. A primary unit arrangement of an inductive power transfer system, comprising:
a primary unit having a primary winding structure for generating a magnetic or electromagnetic field to be received by a secondary unit of the inductive power transfer system in which an electric voltage is induced by magnetic induction,
a detector device for detecting an arrangement comprising the secondary unit, the detector device comprising an electrical conductor,
a determination unit for determining at least one electrical property of the detector device for different regions of the detected arrangement, thereby generating determination results consisting of a determination result for each region of different regions of the detected arrangement,
a comparison unit for comparing the determination results with existing information about a plurality of signatures to generate a comparison result, wherein each signature of the plurality of signatures is characteristic for each arrangement of a plurality of possible arrangements that can be detected, wherein the existing information includes information about expected values for the different regions of a possible arrangement that can be detected,
a decision unit for deciding from the comparison result that the determination results indicates that the detector device has detected the detected arrangement as expected, thereby identifying the detected arrangement comprising the secondary unit, wherein different types of secondary units have different signatures, and
wherein the decision unit is adapted to identify the detected arrangement comprising the secondary unit of a specific type of secondary unit, for which a specific type of secondary unit information about its signature exists, by deciding from the comparison result of the comparison unit whether the determination results indicate that the detector device has identified the detected arrangement comprising the secondary unit of the specific type of secondary unit.

14. The primary unit arrangement of claim 13, wherein the detector device has a plurality of detection elements, each detection element comprising an electrical conductor, wherein the determination unit is adapted to determine at least one electrical property of each of the detection elements, thereby generating the determination results consisting of a determination result for each of the detection elements.

15. The primary unit arrangement of claim 13, further comprising at least one detection field generator for generating an electromagnetic detection field, the detection field generator having an alternating voltage source which is electrically coupled or can be coupled to at least one detection field antenna, thereby forming an oscillating circuit in order to generate an electromagnetic detection field or electromagnetic detection fields, wherein the determination results are obtained in response to the detection fields.

16. The primary unit arrangement of claim 13, wherein the determination unit is adapted to determine the at least one electrical property with respect to a plurality of frequency values of an electromagnetic detection field, which couples the detector device with the detected arrangement, thereby determining information on a frequency dependency of the at least one electrical property, and is adapted to identify different materials of the detected arrangement from the information on the frequency dependency.

17. The primary unit arrangement of claim 13, wherein the determination unit is adapted to determine the at least one electrical property with respect to at least one frequency of an electromagnetic detection field, which couples the detector device with the detected arrangement, wherein the at least one electrical property is determined with respect to one frequency or more than one frequencies which is a resonance frequency or which are resonance frequencies of a winding or of windings of at least one electrical conductor of the primary unit.

18. The primary unit arrangement of claim 13, wherein different primary units of a same type of primary units have different individual signatures and wherein the decision unit is adapted to identify the detected arrangement comprising a specific primary unit of the same type of primary units, for which specific primary unit information about its individual signature exists, by deciding from the comparison result of the comparison unit whether the determination results indicate that the detector device has detected an arrangement comprising the specific primary unit of the same type of primary units.

19. The primary unit arrangement of claim 13, wherein the decision unit is adapted to identify the detected arrangement comprising the secondary unit of the specific type of secondary unit based on a signature that is characteristic of the specific type of second unit for the secondary unit.

\* \* \* \* \*